United States Patent
Ashton et al.

(10) Patent No.: US 6,555,910 B1
(45) Date of Patent: Apr. 29, 2003

(54) USE OF SMALL OPENINGS IN LARGE TOPOGRAPHY FEATURES TO IMPROVE DIELECTRIC THICKNESS CONTROL AND A METHOD OF MANUFACTURE THEREOF

(75) Inventors: Robert A. Ashton, Orlando, FL (US); Steven A. Lytle, Orlando, FL (US); Mary D. Roby, Orlando, FL (US); Morgan J. Thoma, Orlando, FL (US); Daniel J. Vitkavage, Winter Garden, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/651,661

(22) Filed: Aug. 29, 2000

(51) Int. Cl.[7] .................. H01L 23/48; H01L 23/52; H01L 29/40
(52) U.S. Cl. .................. 257/752; 257/758; 257/773
(58) Field of Search .................. 257/758, 752, 257/750, 773, 774

(56) References Cited

U.S. PATENT DOCUMENTS

| | | | | |
|---|---|---|---|---|
| 4,467,345 A | * | 8/1984 | Ozawa | |
| 5,357,140 A | * | 10/1994 | Kozasa | |
| 5,404,045 A | * | 4/1995 | Mizushima | |
| 5,621,241 A | * | 4/1997 | Jain | |
| 5,892,277 A | * | 4/1999 | Ikemizu et al. | |
| 5,894,168 A | * | 4/1999 | Michael et al. | |
| 5,923,088 A | * | 7/1999 | Shine et al. | |
| 5,929,528 A | * | 7/1999 | Kinagawa | |
| 5,955,788 A | * | 9/1999 | Iwasa | |
| 5,965,940 A | * | 10/1999 | Juengling | |
| 5,965,941 A | * | 10/1999 | Weling et al. | |
| 5,986,343 A | * | 11/1999 | Chittipeddei | |
| 6,084,290 A | * | 7/2000 | Shields | |
| 6,100,589 A | * | 8/2000 | Tanaka | |
| 6,107,686 A | * | 8/2000 | Sandhu et al. | |
| 6,157,083 A | * | 12/2000 | Usami et al. | |
| 6,222,270 B1 | * | 4/2001 | Lee | |

* cited by examiner

Primary Examiner—Sheila V. Clark

(57) ABSTRACT

The present invention provides a semiconductor device and method of manufacture thereof that provides improved dielectric thickness control. The semiconductor device includes a metal feature located on a semiconductor substrate, wherein the metal feature has openings formed therein, or depending on the device, therethrough. The semiconductor device further includes a fluorinated dielectric layer located over the metal feature and within the openings. Thus, the inclusion of openings within the metal feature allows for a substantially planar surface of the fluorinated dielectric layer.

26 Claims, 8 Drawing Sheets

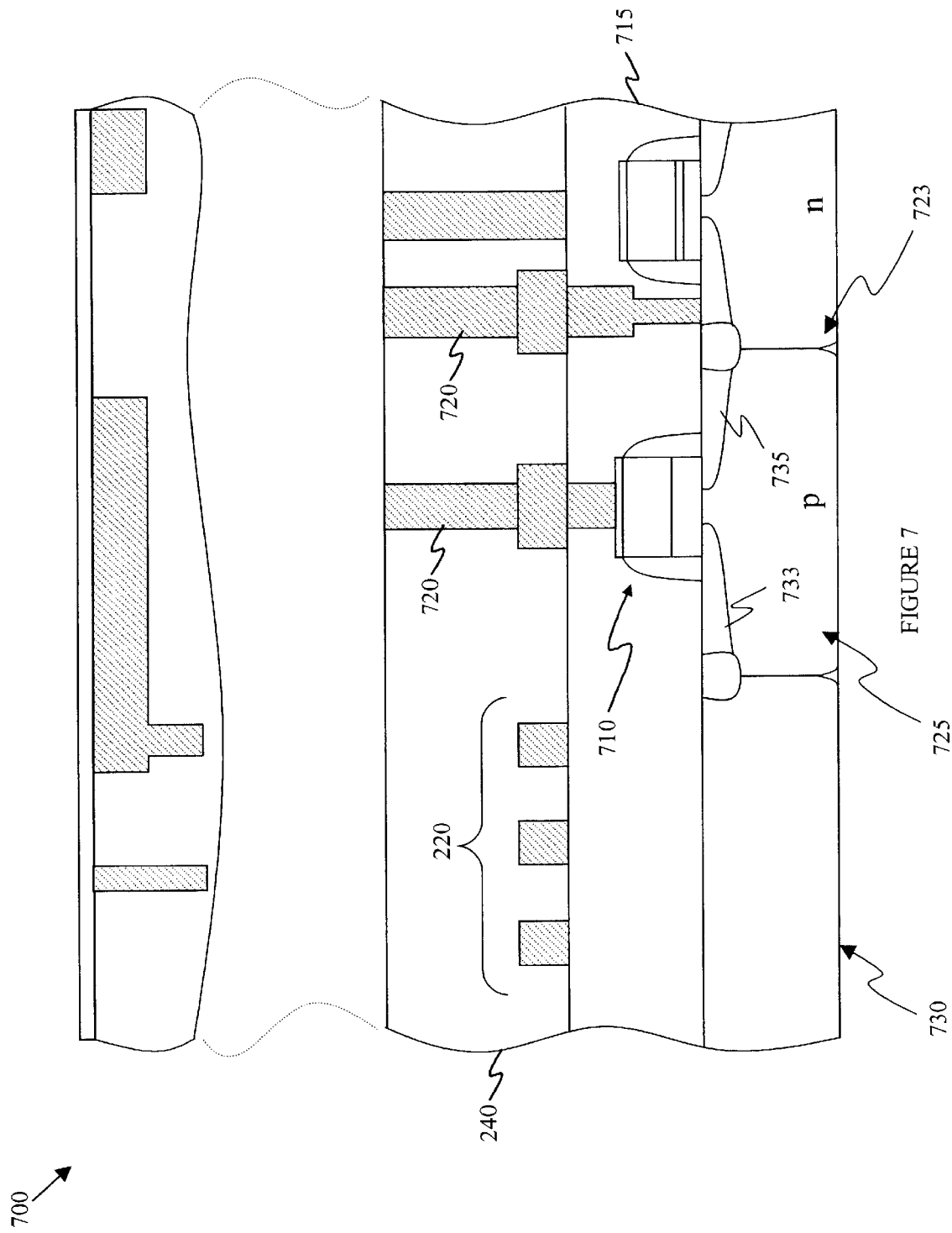

USE OF SMALL OPENINGS IN LARGE TOPOGRAPHY FEATURES TO IMPROVE DIELECTRIC THICKNESS CONTROL AND A METHOD OF MANUFACTURE THEREOF

TECHNICAL FIELD OF THE INVENTION

The present invention is directed, in general, to a semiconductor device and, more specifically, to a semiconductor device having a large topography feature containing small openings located therein to provide improved dielectric thickness control, and a method of manufacture thereof.

BACKGROUND OF THE INVENTION

One problem currently encountered in today's semiconductor technology is the inability to inexpensively and accurately planarize a surface of material. While accurate planarization has always been important within the semiconductor manufacturing industry, it has become even more important with the extremely small submicron device sizes associated with present day technologies. As is well known, it is important to achieve effective planarization to conduct a subsequent, accurate, photolithographic process for such submicron feature sizes.

Generally, current semiconductor technology deposits a layer of material, typically a dielectric material such as fluorinated silicon glass (FSG), over features on a semiconductor wafer. Typically, the FSG is deposited using a high density plasma (HDP) process, which has an isotropic etching component associated with it. The isotropic etching component results from the fluorine gas contained in the high density plasma process and the wafer being at an elevated temperature. The high density plasma process is a net deposition process; however, as it is depositing 5 atoms it might be removing 1 atom. The effects of this isotropic component are quite evident across narrow features having a width of less than about 3000 nm, such as interconnects, which are frequently incorporated into today's integrated circuit designs. This is a result of the narrow features producing. narrow protrusions, and the etching component acting on the sides of the narrow protrusions, and typically converging toward each other and substantially eliminating such protrusions. Even in situations where the sides of the protrusions do not completely converge, if they are narrow enough, they may be easily and effectively planarized with conventional chemical mechanical planarization (CMP) processes. Wide features typically having a width greater than about 3000 nm, such as capacitors, inductors and power buses, are not as advantageously affected by the isotropic etch component of the HDP process, as the narrow features; therefore, the wide features present an entirely different problem.

In certain situations, the dielectric layer is deposited without the fluorine containing gas, therefore no isotropic etching component is present. If the deposition process has an extremely strong physical sputtering component, the protrusions will likewise not form over extremely small features. However, where the isotropic etching component may prevent protrusions over features having a width of about 3000 nm, the strong physical sputtering component is only capable of preventing protrusions over features having a width of about 250 nm. Thus, current semiconductor technologies generally use a process containing an isotropic etching component.

Because the isotropic etch component and the strong physical sputtering component cannot advantageously affect the wide features, as a result of their substantial width, a raised area or anomaly of the deposited material is typically generated above such features. Turning to Prior Art FIG. 1, illustrated is a wide feature 120 and a narrow feature 130 formed over a semiconductor substrate 110. As noticed, when a dielectric material 140 is deposited using a process containing an isotropic etch component or a strong physical sputtering component, a raised area 145 is formed over the wide feature 120 and not over the narrow feature 130. The problem arises when the surface of the dielectric material 140, including the raised area 145, is planarized, typically using a CMP process. Generally, regions containing mainly high areas polish slower than regions containing mostly low areas. This polishing rate differential tends to produce non-uniformity in the material thickness across the chip, which can subsequently affect accuracy, device performance and device yield. Moreover, differences in pattern density between different types of integrated circuits can lead to varying polishing rates, which make manufacturing more difficult and costly.

The semiconductor manufacturing industry, in the past, developed several methods to attempt to minimize pattern density effects during CMP. One method was to alter the various CMP process variables such as down force, carrier speed and polishing pad hardness. Altering the various CMP process variables tends to help; unfortunately, there is a trade-off between within die and across wafer uniformity when these variables are changed. Moreover, the differing variables do not adequately influence the polishing rate. Another method attempted was to deposit "dummy" metal features to even out the pattern density. However, its effectiveness depends on the specifics of the circuit layout and the deposition profile of the dielectric material used. Moreover, the "dummy" metal technique complicates the circuit design by adding extra capacitance that must be taken into account in predicting performance, which may slow down the circuit in some instances. Other methods were also attempted, but similar to the "dummy" metal technique described above, they contained inherent problems.

Accordingly, what is needed in the art is a semiconductor device, including a wide feature, and method of manufacture thereof that takes advantage of the isotropic etch component associated with some present day deposition techniques, and does not experience the problems set forth above with respect to the prior art features.

SUMMARY OF THE INVENTION

To address the above-discussed deficiencies of the prior art, the present invention provides a semiconductor device and method of manufacture thereof that provides improved dielectric thickness control. The semiconductor device includes a metal feature located on a semiconductor substrate, wherein the metal feature has openings formed therethrough. The semiconductor device further includes a fluorinated dielectric layer located over the metal feature and within the openings. Thus, the inclusion of openings within the metal feature allows for a substantially planar surface of the fluorinated dielectric layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIG-URES. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which:

FIG. 7 illustrates a sectional view of a conventional integrated circuit, which might be manufactured according to the principles of the present invention.

DETAILED DESCRIPTION

Figure 1:
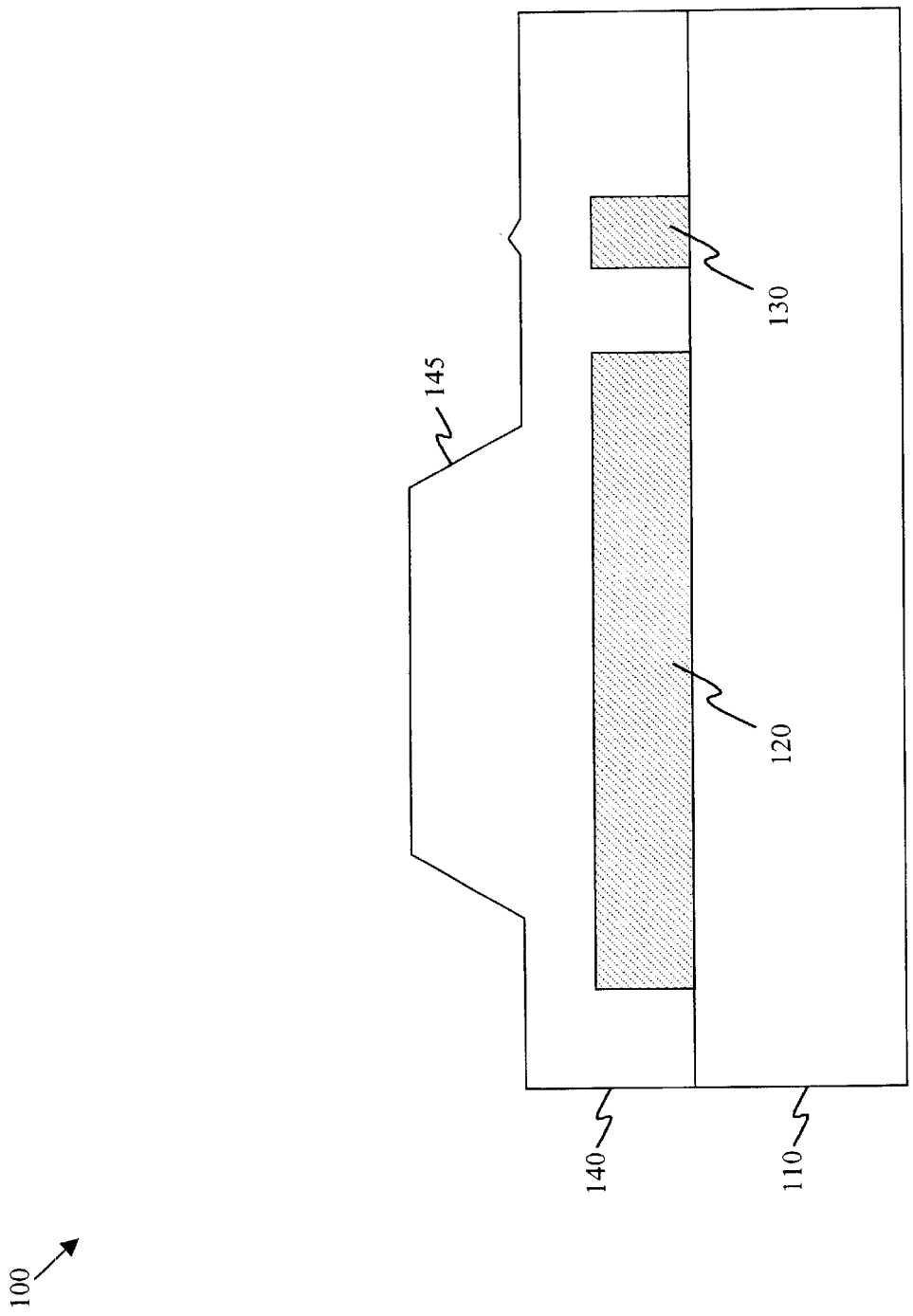
FIG. 1 illustrates a Prior Art semiconductor device including a wide feature and a narrow feature, both formed over a semiconductor substrate.
Figure 2:
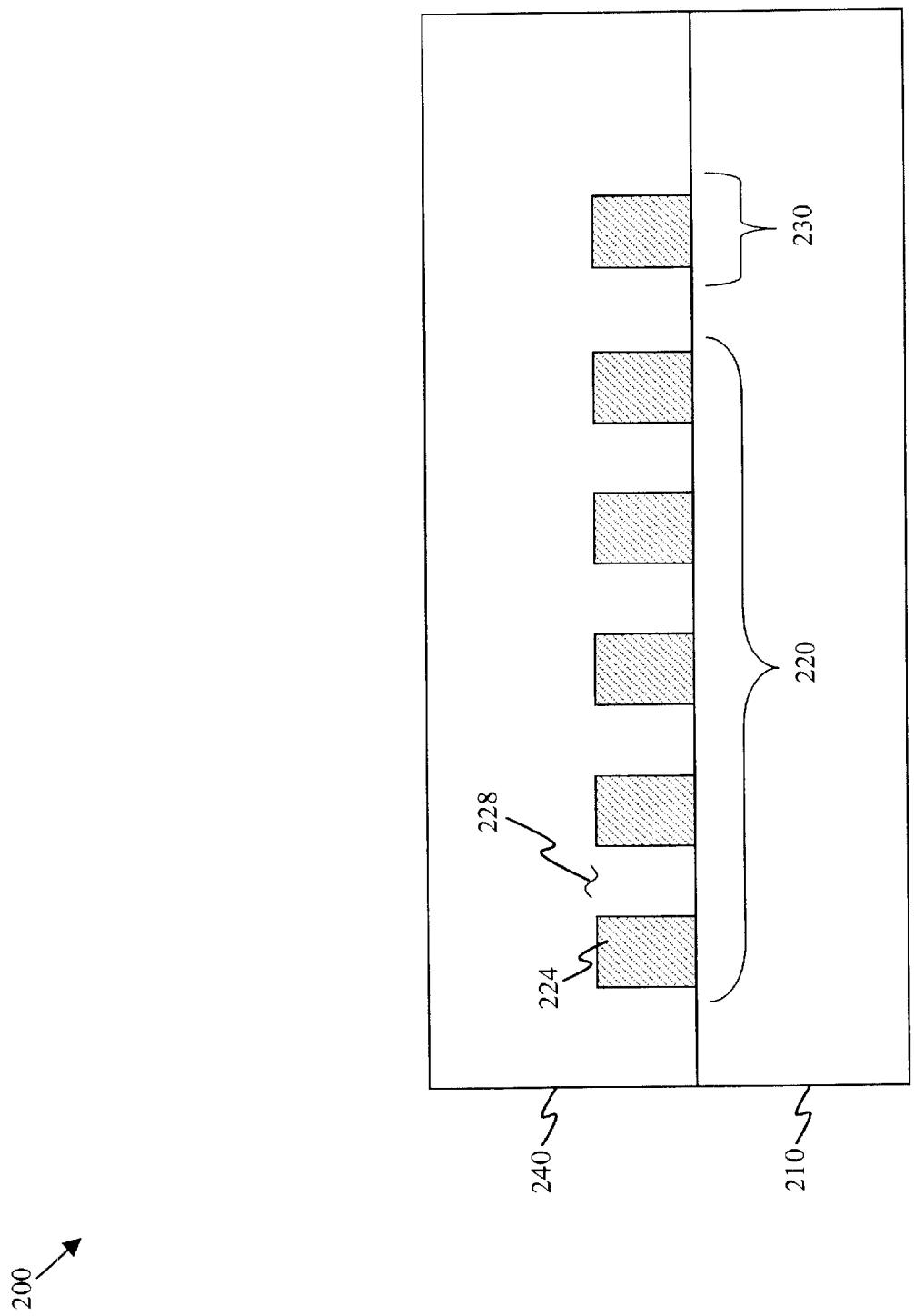
FIG. 2 illustrates a cross-sectional view of a partially completed semiconductor device as disclosed by the present invention after dielectric deposition and chemical mechanical polishing.

Referring initially to FIG. 2, illustrated is a cross-sectional view of a partially completed semiconductor device 200 as disclosed by the present invention. The cross-sectional view is taken through a line illustrated in FIG. 5A, which will be discussed in more detail below. The completed semiconductor device 200 includes a metal feature 220 that has metal feature openings 228 and metal feature portions 224 formed therein. The completed semiconductor device 200 also includes a relatively narrow metal feature 230, wherein both the metal feature 220 and the relatively narrow metal feature 230 are located on a semiconductor wafer substrate 210. It should be noted that the semiconductor wafer substrate 210 may be any substrate located in the semiconductor device 200, including the wafer itself or a substrate located above the wafer.

Located over the metal feature 220 and the relatively narrow metal feature 230 is a dielectric layer 240. The dielectric layer 240 in a preferred embodiment may have a low dielectric constant of about 3.6 For example, the dielectric layer 240 may be a fluorinated oxide dielectric layer, and in an exemplary embodiment may be deposited using a deposition process containing an isotropic etch component, for example a high density plasma (HDP) process. As illustrated, the dielectric layer 240 is also deposited within the openings 228 of the metal feature 220.

The completed semiconductor device 200 provides a metal feature 220 and method of manufacture thereof that typically does not experience substantial raised portions in the surface of the dielectric layer 240 over the metal feature 220. The completed semiconductor device 200 may accomplish this by taking advantage of the isotropic etch component of the dielectric layer deposition process. As such, the metal feature 220 may be patterned having openings 228 therein, such that the metal feature 220 behaves like a series of small features in terms of topography generation during the HDP dielectric deposition process. Moreover, the openings 228 are easily produced, by modifying the mask used to manufacture and print the interconnect level. Thus, the presently described semiconductor device 200 may be manufactured without adding additional processing steps and without the chemical mechanical polishing (CMP) problems associated with the prior art.

Figure 3:
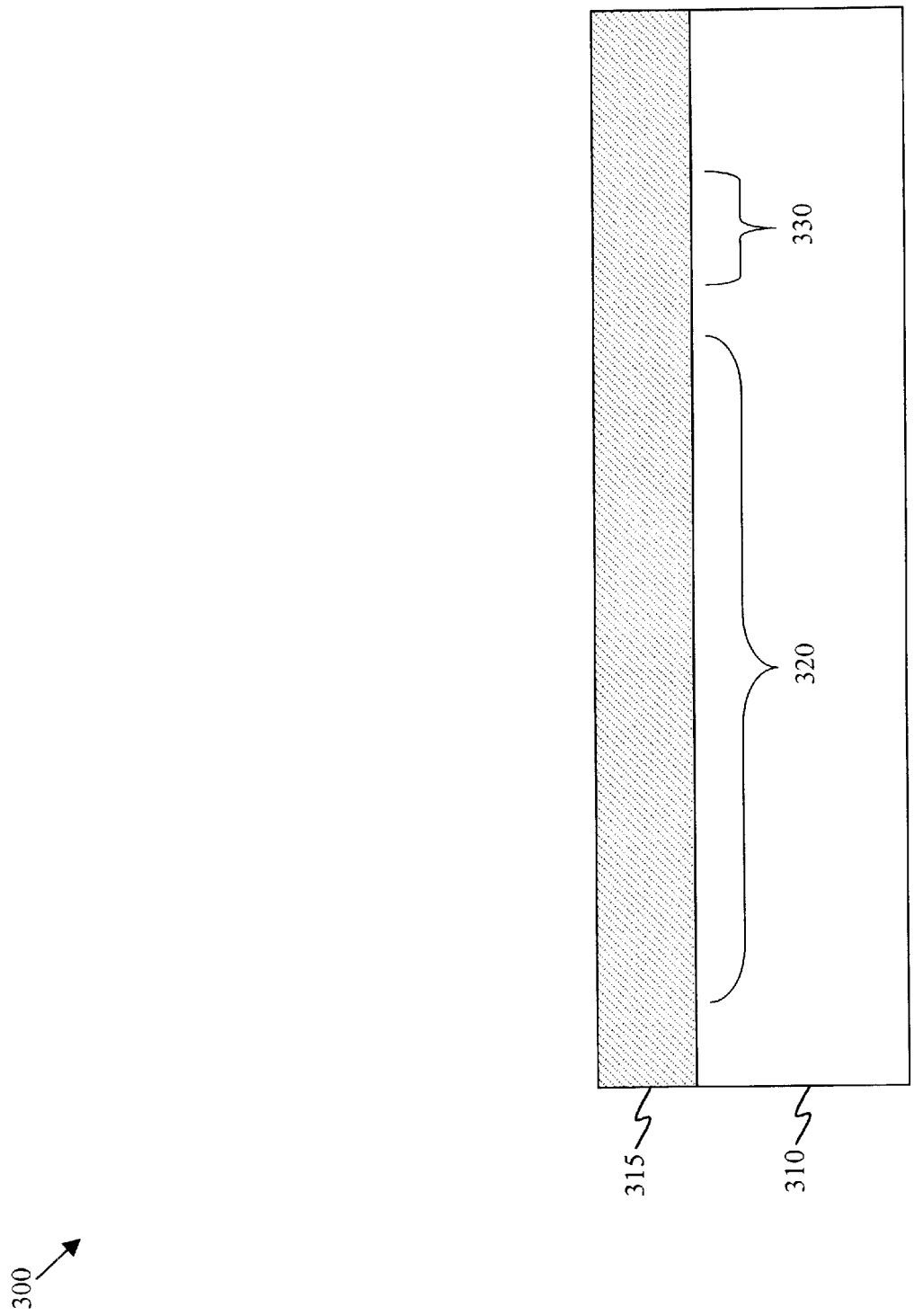
FIG. 3 illustrates a partially completed semiconductor device including a metal layer located on a semiconductor wafer substrate.

Turning to FIGS. 3–5B, illustrated are various stages of manufacture of the semiconductor device 200 illustrated in FIG. 2. FIG. 3 illustrates a partially completed semiconductor device 300 including a metal layer 315 located on a semiconductor wafer substrate 310. The metal layer 315 is conventionally deposited and typically comprises any conductive material commonly used in integrated circuits; for example, aluminum, tungsten or copper could be used as the metal layer 315. Moreover, the metal layer 315 contains a proposed metal feature area 320 and a proposed relatively narrow metal feature area 330.

Figure 4:
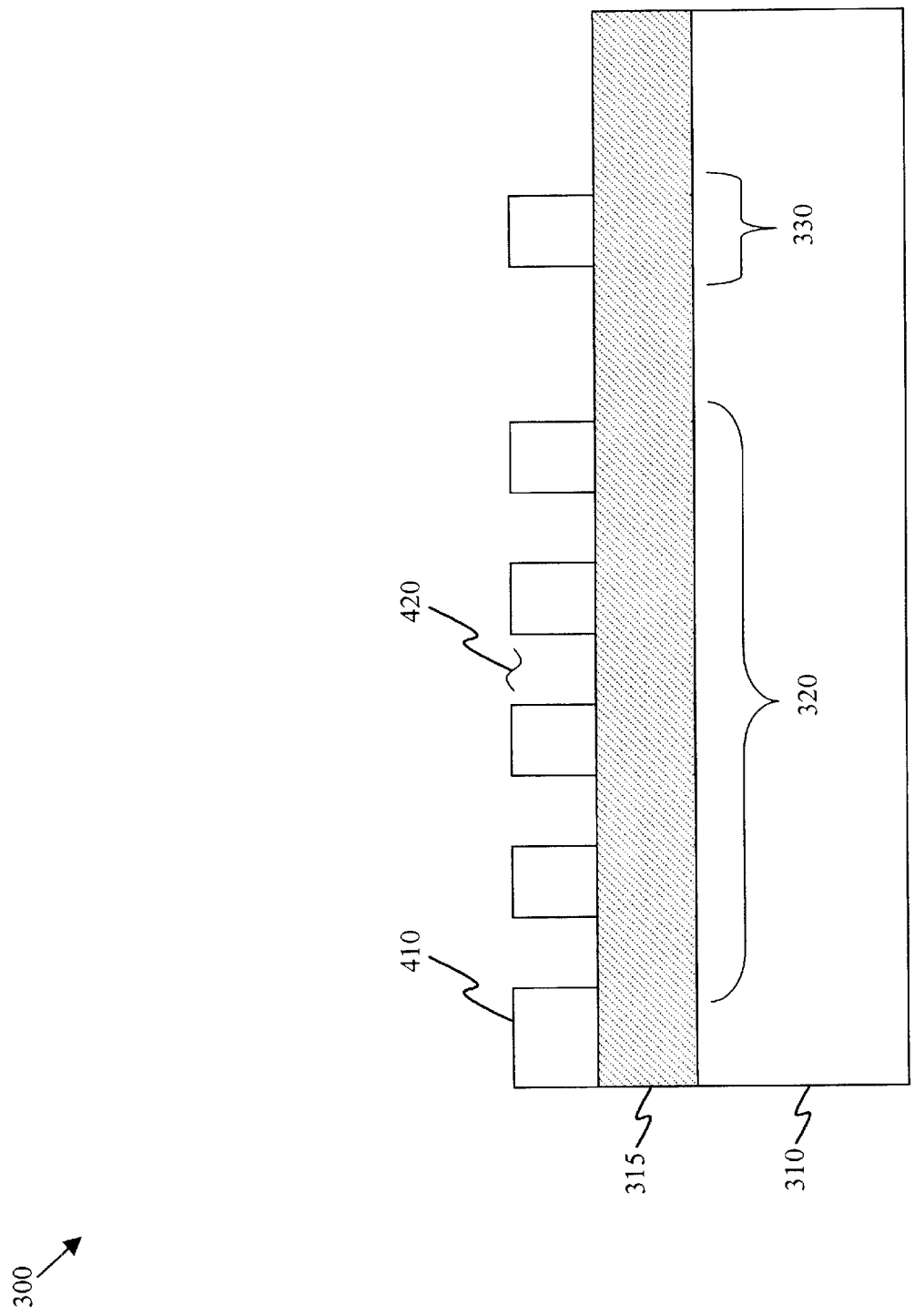
FIG. 4 illustrates the partially completed semiconductor device illustrated in FIG. 3 after a conventional deposition and patterning of a photoresist layer.

Turning to FIG. 4, illustrated is the partially completed semiconductor device 300 illustrated in FIG. 3 after a conventional deposition and patterning of a photoresist layer 410. As illustrated, the photoresist layer 410 is patterned to expose open areas 420 in the photoresist layer 410 over the proposed metal feature area 320. Preferably, a mask having an opening with a width slightly greater than a minimum resolution size of the photolithographic tool is used to pattern the photoresist layer 410. For example, the mask forming the open areas 420 may define minimum width ranging from about 200 nm to about 600 nm. It should be noted that the remaining photoresist layer 410 defines the proposed narrow metal feature area 330. The exposed open areas 420 are then subjected to a conventional etch, for example a plasma etch, a reactive ion etch or other similar etch could be used.

Figure 5A:
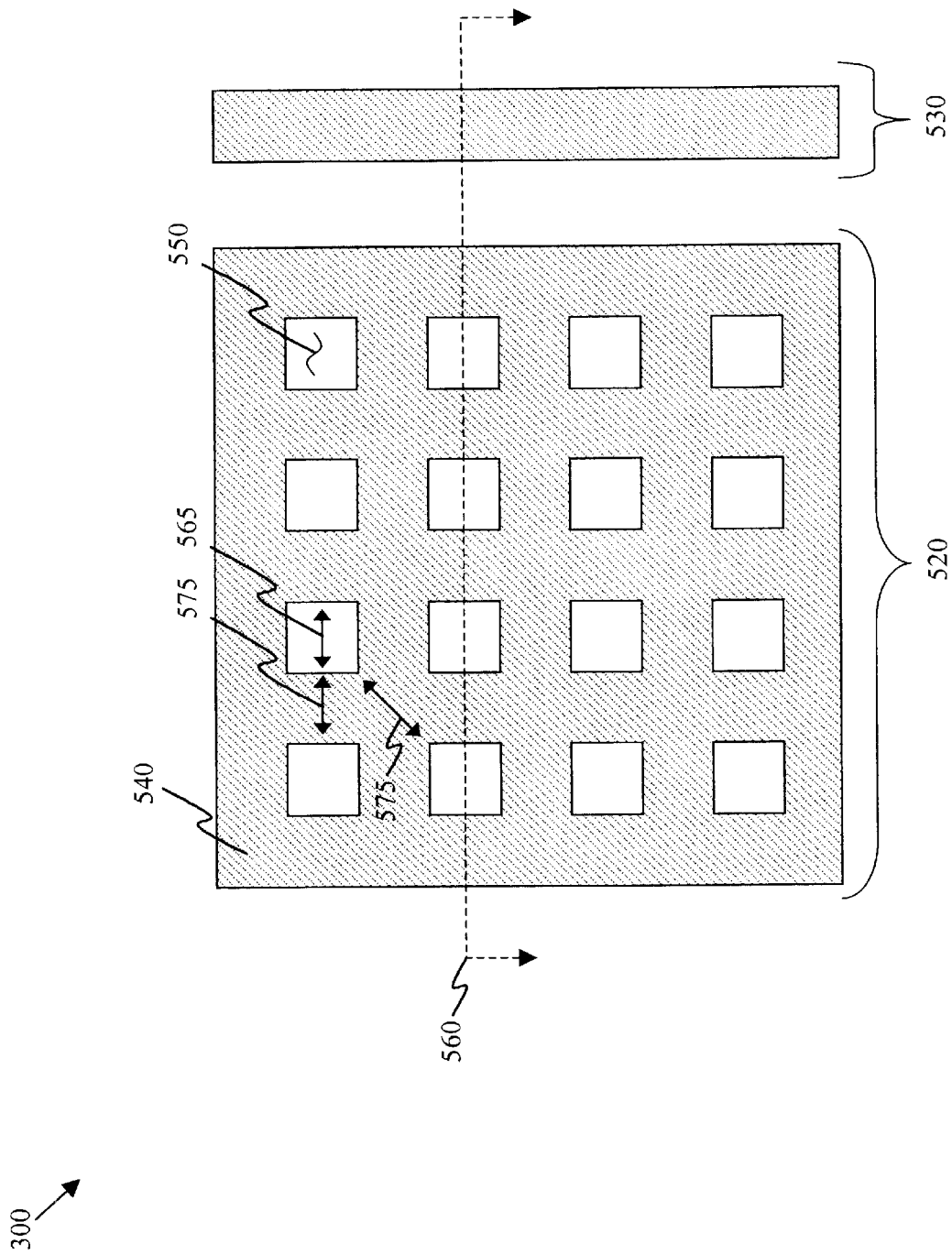
FIG. 5A illustrates a plan view of the partially completed semiconductor device, including lines depicting the cross-section shown in FIGS. 2 and 4.

Turning to FIG. 5A, illustrated is a partial plan view of the partially completed semiconductor device 300, including a line 560 depicting the view shown below in FIG. 5B. The plan view illustrates a metal feature 520, including metal feature portions 540 and metal feature openings 550, and a narrow metal feature 530. As illustrated by the plan view, the metal feature openings 550 form a pattern between interconnected metal lines. In a preferred embodiment, the openings comprise a total area of the metal feature ranging from about 5% to about 15%, and as mentioned earlier may have a width 565 defined by the minimum resolution size of a photolithographic tool. Today, this minimum resolution of the photolithographic tools ranges from about 200 nm to about 600 nm; however, in the future it is expected to decrease.

The distance between any two openings 570 may, in a preferred embodiment, be defined by the thickness of the dielectric layer 240 (FIG. 2) located thereover. In an exemplary embodiment, the distance between any two adjoining openings 570 should range from about 1 to about 2 times the thickness of the dielectric layer 240. For example, in one advantageous embodiment, the dielectric layer has a thickness ranging from about 800 nm to about 2500 nm and any two adjoining openings have a distance 570 there between ranging from about 1000 nm to about 5000 nm. In embodiments having a similar design as that shown in FIG. 5A, a diagonal distance 575 between any two adjoining openings 550 could range from about 1 to about 2 times the thickness of the dielectric layer 240. Thus, the diagonal distance 575 should similarly have a distance ranging from about 1000 nm to about 5000 nm.

Figure 5B:
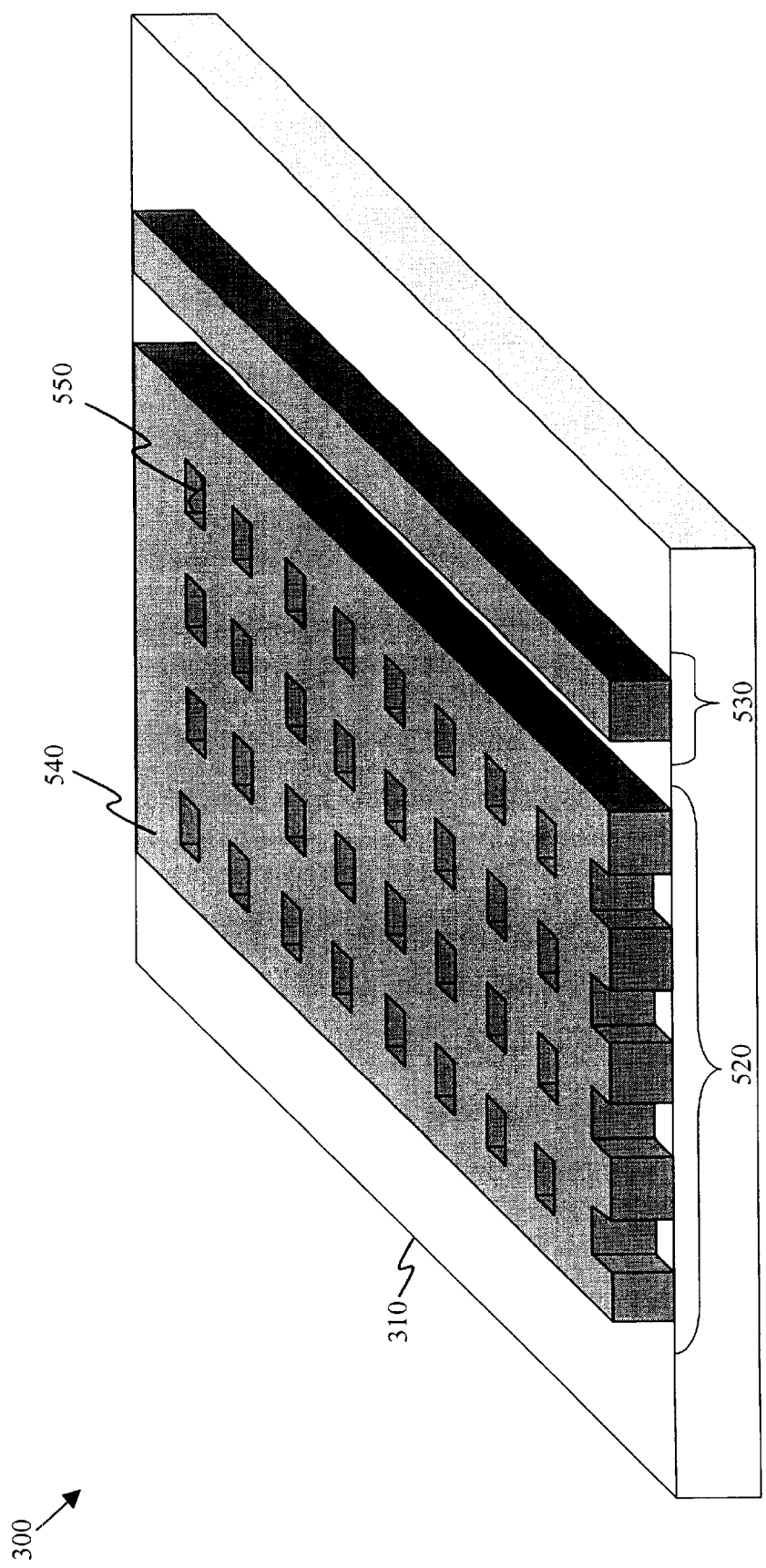
FIG. 5B illustrates a three dimensional view of the partially completed semiconductor device illustrated in FIG. 4 after a conventional etch, including metal feature openings and metal feature portions.

Turning to FIG. 5B illustrated is a 3-dimensional view taken through the line 560 depicted in FIG. 5A above. FIG. 5B shows the metal feature 520 and the relatively narrow metal feature 530, both formed during the etch process described above. The metal feature 520 is generally an interconnect trace; however, the metal feature 520 could be a part of capacitor, an inductor, a power bus or other similar device. Moreover, the metal feature 520 is generally a feature having a width that is sufficient to produce a substantial anomaly in the fluorinated dielectric layer 250. (FIG. 2). A substantial anomaly is one that is large enough such that it results in a substantially non-planar surface prior to a CMP process. An exemplary width of such a feature may be a width greater than about 5000 nm. However, narrower widths may also fall within the scope of the present invention. In contrast, the relatively narrow metal feature 530 is a feature that either leaves no anomaly after the HDP process or leaves only small, sharp anomalies, such as small protrusions or horns.

As illustrated in FIG. 5B, the metal feature 520 contains the metal feature portions 540 and metal feature openings 550. The resulting metal feature portion 540 have a width substantially equal to the width of the narrow metal feature 530, and as mentioned above, the openings 550 have a width substantially equal to or slightly greater than the minimum resolution size of the photolithographic tool used. Moreover, the metal feature portion 540 represents a portion of the proposed metal feature area 320 protected by the photoresist 410 and not removed by the etch described above. (FIG. 3) It should also be recognized that the narrow metal feature 530 does not have an opening formed therein. As illustrated in this advantageous embodiment, the etch described above etches through the metal feature 520 to the substrate 310. Thus, as illustrated in FIGS. 4–5B, the partially completed semiconductor device 300 is manufactured having the metal feature openings 550 formed within the metal feature 520 without adding any additional processing steps.

Figure 6:
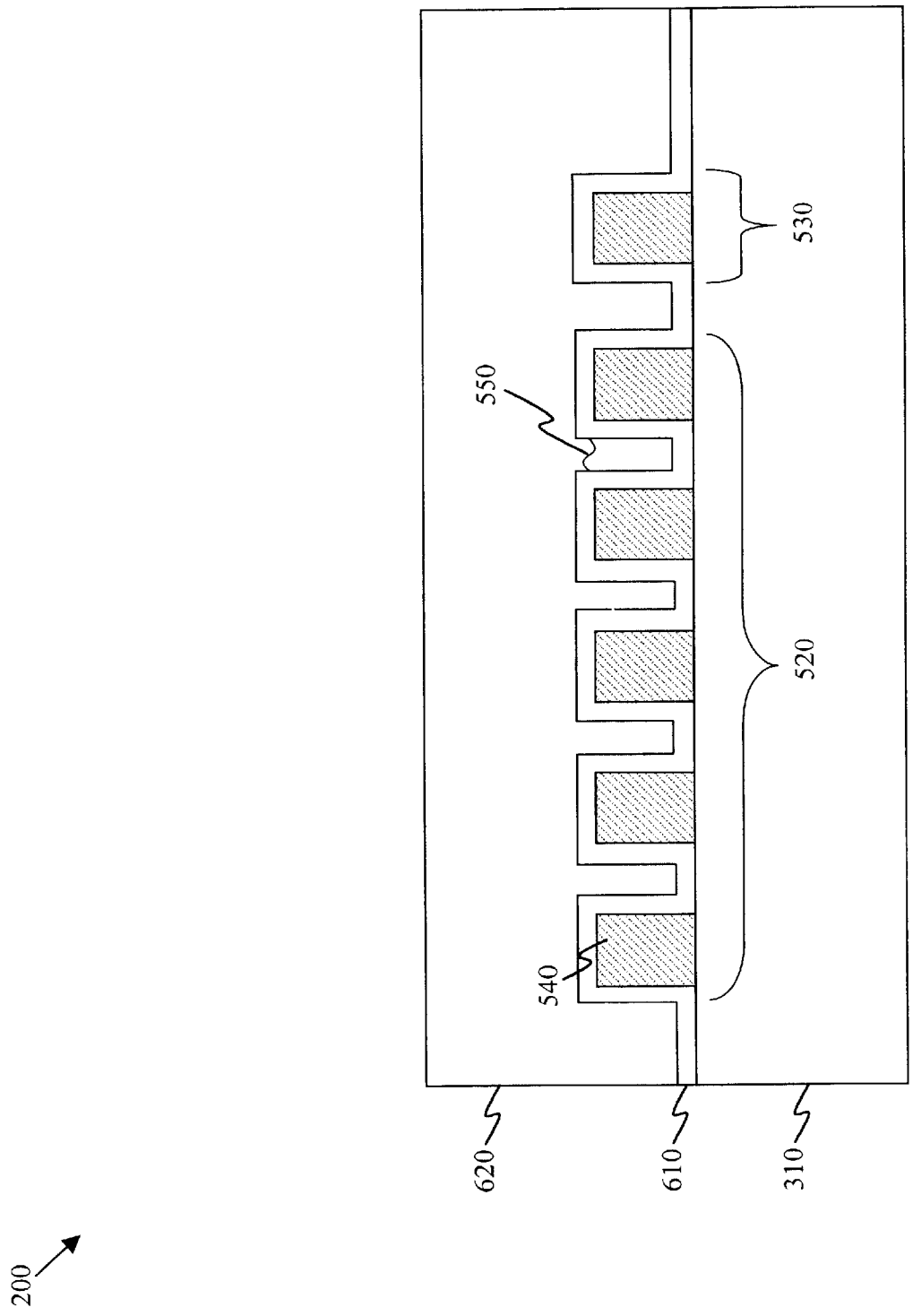
FIG. 6 illustrates the partially completed semiconductor device illustrated in FIGS. 5A and 5B, after formation of an optional barrier layer.

Turning to FIG. 6, illustrated is a preferred embodiment of the partially completed semiconductor device 300. After formation of the metal feature portions 540 and metal feature openings 550 illustrated in FIG. 5, a dielectric barrier layer 610 may be deposited over the features 520, 530, and within the opening 550, and a fluorinated dielectric layer 620, depicted 240 in FIG. 2, may be deposited over the barrier layer. The surface of the fluorinated dielectric layer 620 is shown as being substantially flat, however, it should be noted that small, easy to polish, raised features could be located over each metal feature portion 540 and the relatively narrow metal feature 530. One having skill in the art understands that the inclusion of the dielectric barrier layer 610 is only a preferred embodiment, and that the scope of the invention is not limited by such a barrier layer 610.

Turning briefly to FIG. 7 with continued reference to FIG. 2, there is illustrated a cross-sectional view of a conventional integrated circuit 700, that might be manufactured according to the principles of the present invention. The integrated circuit 700 may include CMOS devices, BiCMOS devices, Bipolar devices, EEPROM devices, including flash EPROMS, or any other type of similar device. Also shown in FIG. 7 are components of the conventional integrated circuit 700, including: transistors 710, a first dielectric layer 715, the metal feature 220 and the fluorinated dielectric layer 240. The metal feature 220 along with interconnect structures 720 form part of an interconnect system that electrically connects the transistors 710 to form an integrated circuit 700. Moreover, one having skill in the art knows how to electrically connect the metal feature 220 to complete the integrated circuit 700. Also illustrated, are conventionally formed tubs, 723, 725, source regions 733 and drain regions 735, all located over a substrate 730.

Although the present invention has been described in detail, those skilled in the art should understand that they can make various changes, substitutions and alterations herein without departing from the spirit and scope of the invention in its broadest form.

What is claimed is:

1. A semiconductor device, comprising:
 a unitary metal feature having a plurality of openings formed therein located on a semiconductor substrate; and
 a dielectric layer located over the metal feature and within the openings, the openings substantially reducing a size of dielectric layer raised portions formed over the metal feature allowing for a substantially planar surface.

2. The semiconductor device as recited in claim 1 wherein the openings are formed through the metal feature.

3. The semiconductor device as recited in claim 1 wherein the openings have dimensions substantially equal to a minimum resolution size of a photolithography tool used to form the openings.

4. The semiconductor device as recited in claim 1 wherein the openings having a width ranging from about 200 nm to 600 nm.

5. The semiconductor device as recited in claim 1 wherein the metal feature is an interconnect trace.

6. The semiconductor device as recited in claim 1 wherein the metal feature is a first metal. feature and further including a second metal feature having a width substantially narrower than a width of the first metal feature, the second metal feature being free of a opening.

7. The semiconductor device as recited in claim 6 wherein the openings form a pattern of interconnected metal lines in the metal feature such that the metal lines have a width substantially equal to the second metal feature.

8. The semiconductor device as recited in claim 1 wherein the dielectric layer is a fluorinated dielectric layer.

9. The semiconductor device as recited in claim 1 wherein the dielectric layer has an isotropic etching component associated therewith.

10. The semiconductor device as recited in claim 1 wherein the dielectric layer has a dielectric constant of 3.6.

11. An integrated circuit, comprising:
 transistors;
 a first dielectric layer located over the transistors;
 a unitary metal feature having a plurality of openings formed therein located on a semiconductor substrate; and
 a dielectric layer located over the metal feature and within the openings, the openings substantially reducing a size of dielectric layer raised portions formed over the metal feature allowing for a substantially planar surface; and interconnects and the metal features connecting the transistors to form an integrated circuit.

12. The integrated circuit as recited in claim 11 wherein the openings are formed through the metal feature.

13. The integrated circuit as recited in claim 11 wherein the openings have dimensions substantially equal to a minimum resolution size of a photolithography tool used to form the openings.

14. The integrated circuit as recited in claim 11 wherein the openings have a width ranging from about 200 nm to 600 nm.

15. The integrated as recited in claim 11 wherein the metal feature is an interconnect trace.

16. The integrated circuit as recited in claim 11 wherein the metal feature is a first metal feature and further including a second metal feature having a width substantially narrower than a width of the first metal feature, the second metal feature being free of a opening.

17. The integrated circuit as recited in claim 16 wherein the openings form a pattern of interconnected metal lines in the metal feature such that the metal lines have a width substantially equal to the second metal feature.

18. The integrated circuit as recited in claim 11 wherein the dielectric layer is a fluorinated dielectric layer.

19. The integrated circuit as recited in claim 11 wherein the dielectric layer has an isotropic etch component associated therewith.

20. A semiconductor device, comprising:
a unitary metal feature having a plurality of openings formed therein located on a semiconductor substrate, wherein a total area of the openings comprises from about 5% to about 15% of a total area of the metal feature; and
a dielectric layer located over the metal feature and within the openings, the openings substantially reducing a size of dielectric layer raised portions formed over the metal feature allowing for a substantially planar surface.

21. The semiconductor device recited in claim 20 wherein the dielectric layer has a thickness ranging from 800 nm to 2500 nm.

22. The semiconductor device recited in claim 20 wherein any distance between the openings ranges from 1 to 2 times a thickness of the dielectric layer.

23. The semiconductor device recited in claim 20 wherein a diagonal distance between the openings ranges from 1 to 2 times a thickness of the dielectric layer.

24. The semiconductor device recited in claim 23 wherein the diagonal distance ranges from 1000 nm to 5000 nm.

25. The semiconductor device recited in claim 20 wherein the openings have a width ranging from 200 nm to 600 nm.

26. The semiconductor device recited in claim 20 wherein the dielectric layer has a dielectric constant of 3.6.

* * * * *